US010096694B2

United States Patent
Coquand et al.

(10) Patent No.: US 10,096,694 B2
(45) Date of Patent: Oct. 9, 2018

(54) PROCESS FOR FABRICATING A VERTICAL-CHANNEL NANOLAYER TRANSISTOR

(71) Applicant: Commissariat a l'energie atomique et aux energies alternatives, Paris (FR)

(72) Inventors: Remi Coquand, Les Marches (FR); Emmanuel Augendre, Montbonnot (FR); Shay Reboh, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/583,304

(22) Filed: May 1, 2017

(65) Prior Publication Data

US 2017/0330958 A1 Nov. 16, 2017

(30) Foreign Application Priority Data

May 2, 2016 (FR) .................... 16 53956

(51) Int. Cl.
*H01L 29/66* (2006.01)
*H01L 21/306* (2006.01)
(Continued)

(52) U.S. Cl.
CPC .. *H01L 29/66666* (2013.01); *H01L 21/28008* (2013.01); *H01L 21/3081* (2013.01); *H01L 21/30604* (2013.01); *H01L 21/31111* (2013.01); *H01L 21/76802* (2013.01); *H01L 21/76877* (2013.01); *H01L 29/165* (2013.01);
(Continued)

(58) Field of Classification Search
CPC ..... H01L 21/823487; H01L 21/823885; H01L 27/10876
See application file for complete search history.

(56) References Cited

U.S. PATENT DOCUMENTS

| | | |
|---|---|---|
| 2001/0028067 A1 | 10/2001 | Awano |
| 2003/0094637 A1 | 5/2003 | Awano |

(Continued)

FOREIGN PATENT DOCUMENTS

| | | |
|---|---|---|
| EP | 2 830 097 A1 | 1/2015 |
| WO | WO 2014/098999 A1 | 6/2014 |

OTHER PUBLICATIONS

French Preliminary Search Report (with Written Opinion) dated Jan. 31, 2017 in French Application 16 53956 filed on May 2, 2016 (with English Translation of Categories of Cited Documents).

*Primary Examiner* — Mohammad Choudhry
(74) *Attorney, Agent, or Firm* — Oblon, McClelland, Maier & Neustadt, L.L.P.

(57) ABSTRACT

A process for fabricating a vertical transistor is provided, including steps of providing a substrate surmounted by a stack of first to third layers made of first to third semiconductors materials of two different types; partially etching the first and third layers with an etching that is selective, so as to form a first void in the first layer and a third void in the third layer, extending to the lower surface and to the upper surface of the second layer, respectively; filling the voids in order to form spacers making contact with the lower surface and the upper surface, respectively; partially etching the second layer with an etching that is selective, so as to form a second void between the first and second spacers; and depositing a conductor material in the second void.

18 Claims, 10 Drawing Sheets

(51) Int. Cl.
  *H01L 21/311* (2006.01)
  *H01L 21/768* (2006.01)
  *H01L 21/308* (2006.01)
  *H01L 21/28* (2006.01)
  *H01L 29/165* (2006.01)
  *H01L 29/45* (2006.01)

(52) U.S. Cl.
  CPC ............ *H01L 29/45* (2013.01); *H01L 29/665* (2013.01); *H01L 29/6656* (2013.01); *H01L 29/66234* (2013.01)

(56) References Cited

U.S. PATENT DOCUMENTS

| | | |
|---|---|---|
| 2007/0173027 A1 | 7/2007 | Rhie |
| 2009/0155974 A1 | 6/2009 | Rhie |
| 2012/0001192 A1 | 1/2012 | Fox et al. |
| 2012/0119262 A1 | 5/2012 | Noort et al. |
| 2014/0166981 A1 | 6/2014 | Doyle et al. |
| 2015/0072490 A1 | 3/2015 | Doyle et al. |
| 2015/0108548 A1 | 4/2015 | Dunn et al. |
| 2015/0140771 A1 | 5/2015 | Fox et al. |
| 2015/0303275 A1 | 10/2015 | Dunn et al. |
| 2016/0163856 A1 | 6/2016 | Doyle et al. |

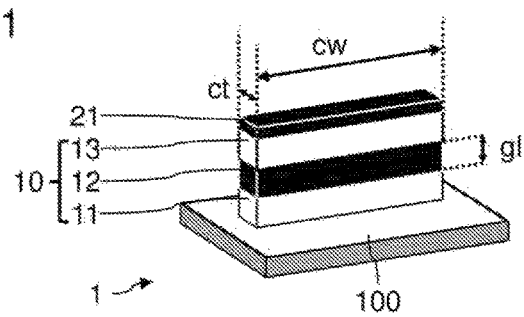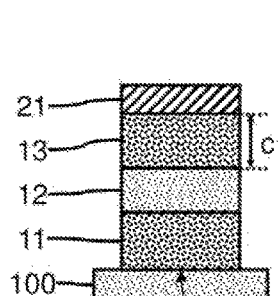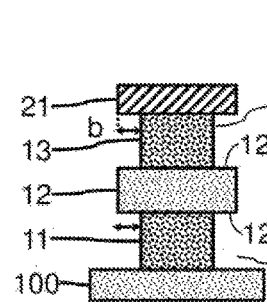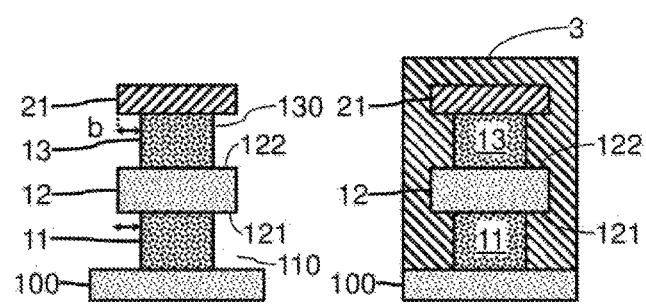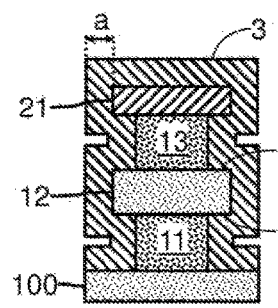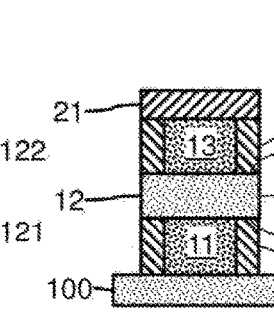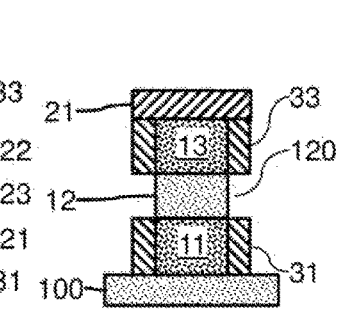

PROCESS FOR FABRICATING A VERTICAL-CHANNEL NANOLAYER TRANSISTOR

The invention relates to vertical-channel transistors and in particular to processes for fabricating such transistors.

The increase in the performance of integrated circuits due to the miniaturization of field-effect transistors is confronted with technological and scientific roadblocks. One of the underlying problems is the increase in static and dynamic power in integrated circuits. In order to decrease this consumed power, new architectures and new materials that will allow a low operating voltage to be obtained are currently the subject of intense research.

In particular, for technological nodes under 50 nm, electrostatic control of the channel by the gate becomes a predominant operating parameter for the operation of the transistor. To improve this electrostatic control, various multiple-gate transistor technologies are being researched; in particular, gate-all-around nanowire transistors are being researched. However, the very small available gate length of gate-all-around transistors makes them difficult to fabricate and limits the capacity to obtain high currents in the on state.

In order to allow longer gate lengths while preserving a planar integration density similar to that of gate-all-around transistors, vertical-channel nanolayer transistor structures have been proposed. The difficulty with such transistors is that their structure is very different from that of planar field-effect transistors. These structural differences imply very different fabricating processes. The sources of manufacturing variability are thus very different and the dimensional design rules governing the layout of vertical transistors are also very different, thereby making industrialization of such transistors even more problematic.

The invention aims to solve one or more of these drawbacks. Thus, the invention relates to a process for fabricating a vertical transistor, such as defined in Claim 1.

The invention also relates to the variants defined in the dependent claims. Those skilled in the art will understand that each of the features of the variants of the dependent claims may be independently combined with the features of Claim 1, without however constituting an intermediate generalisation.

Other features and advantages of the invention will become more dearly apparent from the description that is given thereof below, by way of completely nonlimiting indication, with reference to the appended drawings, in which:

FIG. 1 is a schematic perspective view of a nanowire stack for a vertical-channel field-effect transistor, illustrating dimensional parameters of the channel;

FIGS. 2 to 20 are transverse cross-sectional views during various steps of a process for fabricating a vertical-channel field-effect transistor according to one example of a first embodiment of the invention;

Figure 8:
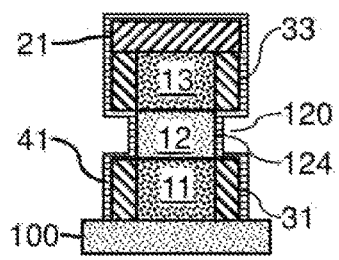

FIG. 1 is a schematic perspective view of a stack 10 of nanowire or nanolayer layers, able to form the substructure of a vertical-channel field-effect transistor 1. A layer 11 of a first semiconductor material, a layer 12 of a second semiconductor material and a layer 13 of a third semiconductor material are superposed in the stack 10, which is formed on a substrate 100. Although not illustrated, the substrate 100 and the stack 10 may be separated by a well and/or deep trench isolations. The layers 11 to 13 are nanowire or nanolayer layers. The layer 13 is covered with an insulating layer 21 forming a hard mask. The layers 11 to 13 are intended to form first and second conductive electrodes of the transistor, the layer 12 being intended to form the channel zone of this transistor. The semiconductor material of the layer 12 is different from that of the layers 11 and 13.

The layers 11 and 13 are advantageously made from the same semiconductor material. The layers 11 and 13 are typically doped with a view to optimizing their electrical properties. By way of example, the substrate 100 is a bulk substrate, for example a silicon substrate, for example one that is lightly doped p-type. The layers 11 and 13 are for example initially made of a silicon-germanium alloy (they are for example made of doped SiGe, for example of B-doped SiGe), and the layer 12 may be made of unintentionally doped silicon (or for example silicon that has been doped with the intention of modifying the threshold voltage of the transistor to be formed). The insulating layer 21 is for example made of SiN. Other materials may of course be envisaged in the context of the invention. It is for example possible to envisage producing the layers 11 and 13 from silicon (or from doped silicon, p-doped silicon for example) and to produce the layer 12 from a silicon-germanium alloy. It is also possible to envisage producing the layers 11 to 13 from III-V semiconductors (InGaAs, InP, etc. for example).

FIG. 1 illustrates the dimensional parameters of the channel zone of the transistor 1 produced with a stack 10. Assuming that the layer 12 corresponds to the definitive shape of the channel zone of the transistor, such a transistor has a gate length or channel length gl (dimension normal to the substrate 100) corresponding to the thickness of the layer 12, a channel width cw corresponding to the length (dimension in the longitudinal direction) of the layer 12, and a channel thickness ct corresponding to the width (dimension in the transverse direction) of the layer 12. In order to achieve both a high on-state current and good electrostatic control of the channel, the value cw is advantageously at least equal to 2 times the value ct.

FIGS. 2 to 20 are transverse cross-sectional views of an example transistor 1 in various steps of an example of a first embodiment of a fabricating process.

In FIG. 2, a substrate 100 such as detailed above is provided, said substrate being surmounted by a stack of a layer 11 made of silicon-germanium alloy formed on the substrate 100, a layer 12 made of silicon, and a layer 13 made of silicon-germanium alloy. The silicon-germanium alloy may be doped with boron for example with a dopant density comprised between $5 \times 10^{19}$ cm$^{-3}$ and $5 \times 10^{20}$ cm$^{-3}$ and preferably equal to $2 \times 10^{20}$ cm$^{-3}$. The stack of the layers 11 to 13 may be obtained beforehand via epitaxial growth steps, in a way known per se. The materials of the layers 11 to 13 are selected both depending on the electrical performance desired for the transistor 1, and so that etching processes are available to selectively etch the layers 11 and 13 with respect to the layer 12, and vice versa.

The stack of the layers 11 to 13 here has a thickness typically comprised between 10 and 300 nanometers. The layer 12 has a thickness typically comprised between 5 and 100 nm (15 nm for example), the definition of its thickness facilitating the definition of the electrical length of the channel. The layers 11 and 13 here have the same thickness, which is identified by the parameter c. The layers 11 and 13 may also have different thicknesses, for example with a view to adjusting their electrical resistances. The layers 11 and 13 typically have a thickness c comprised between 3 and 100 nm (20 nm for example). In order to decrease the contact resistance at the source or drain of a transistor 1, the thickness c is advantageously at most equal to 15 nm. A small value of the thickness c also facilitates the subsequent formation of the spacers.

The layer 13 is covered with an insulating layer 21. The insulating layer 21 is typically made of SiN, of $SiO_2$ or of a combination of these two materials. The layer 21 forms a hard mask for the stack. The layer 21 here has a width comprised between 10 and 100 nanometers (40 nm for example), corresponding to the initial width of the stack. The insulating layer 21 may be used beforehand to anisotropically etch the layers 11 to 13, so that the latter have substantially the same length and same width, corresponding to the pattern of the insulating layer 21. Such an etching may also be used to make crystal planes such as the (100) or (110) planes appear, depending on the lithography and chemistry used, in order for example to simply and directly disassociate nMOS and pMOS structures to be formed.

In FIG. 3, the layers 11 and 13 are partially etched, this etching being selective with respect to the layer 12 and to the layer 21. The silicon-germanium alloy of the layers 11 and 13 is for example partially etched with hydrochloric-acid vapour, allowing the layer 12 to be preserved with substantially the same dimensions.

Thus a void 110 is formed on either side of the residual layer 11, and a void 130 is formed on either side of the residual layer 13. The voids 110 and 130 extend to the lower surface 121 and to the upper surface 122 of the layer 12, respectively. The voids 110 and 130 have the same dimension as the layers 11 and 13 in the stacking direction (here the vertical direction or the direction normal to the substrate 100), respectively. A portion of the upper surface 122 and of the lower surface 121 of the layer 12 is thus uncovered. The voids 110 and 130 are here etched to a depth illustrated by the parameter b, with respect to the edges of the layers 12 and 21. This depth b is for example comprised between 3 and 15 nm, and is for example equal to 5 nm.

In FIG. 4, the voids 110 and 130 are filled with a dielectric material 3. In this example, the dielectric material is an Lk dielectric, i.e. a dielectric that has a dielectric constant at most equal to 5. The dielectric material 3 is for example SiOC or SiBCN. In the illustrated example, the stack of the layers 11 to 13 and 21 is encapsulated in the dielectric material 3. The dielectric material 3 is in particular deposited so as to make contact with the previously uncovered portion of the lower 121 and upper surfaces, 122. Advantageously, b>c/2 in order to ensure dielectric material is preserved in the voids 110 and 130 after subsequent etching steps.

Advantageously, the dielectric material 3 is deposited so as to completely fill the voids 110 and 130. FIG. 5 illustrates one variant in which the dielectric 3 is formed by a step of conformal deposition. SiOC may for example be deposited by a plasma-enhanced atomic layer deposition process. This conformal deposition is here carried out to a thickness defined by the parameter a. Advantageously, a>b, so that the voids 110 and 130 are entirely filled with the dielectric material 3.

In FIG. 6, starting from the configuration in FIG. 4, the dielectric layer 3 is isotropically etched. An isotropic wet chemical etching may for example be envisaged for a dielectric layer 3 made of SiOC, so as to preserve spacers 31 and 33 on the periphery of the layer 11 and on the periphery of the layer 13, respectively. Such a chemical etching is chosen to be selective with respect to the materials of layers 11 to 13 and 21. Alternatively, the layer 21 and the layer 12 serve as a mask for an anisotropic etching, the spacers 31 and 33 (residue of the layer 3 after etching) then self-aligning with the layers 21 and 12. A spacer is thus formed on the periphery of the layer 11, and a spacer 33 is formed on the periphery of the layer 13. The spacer 31 extends between the substrate 100 and the layer 12 (and therefore has the same vertical dimension as the layer 11), and the spacer 33 extends between the layer 12 and the layer 21 (and therefore has the same vertical dimension as the layer 13). The anisotropic etching here uncovers a lateral face 123 of the layer 12.

In FIG. 7, the layer 12 is partially etched, this etching being selective with respect to the spacers 31 and 33. The silicon of the layer 12 is for example partially etched with TMAH, with HCl, or with KOH. The layers 11 and 13 remain protected under the spacers 31 and 33. The etching of the layer 12 is carried out so as to form a void 120 on either side of this layer 12, between the spacers 31 and 33. This etching is advantageously carried out to a depth equal to the parameter b. The bottom of the voids 120 is then aligned with the interface between the spacers 31, 33 and the layers 11 and 13, respectively (the voids 120 therefore have the same vertical dimension as the layer 12).

In FIG. 8, a dielectric layer 41 is deposited by conformal deposition. In this example, the dielectric material of the layer 41 is a Hk dielectric, i.e. it has a dielectric constant at least equal to 6. The dielectric material of the layer 41 is for example $HfO_2$ (for example deposited by atomic layer deposition). The dielectric material of the layer 41 is for example deposited with a thickness of at most 3 nm. The dielectric material of the layer 41 is deposited in the voids 120 and makes contact with the lateral faces 124 of the layer 12. Advantageously, an interface layer, for example made of $SiO_2$ having a thickness comprised between 1 and 2 nm, may be deposited beforehand. The layer 41 has the same vertical dimension as the layer 12.

Figure 9:
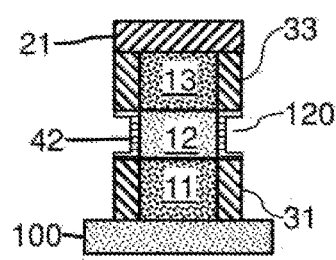

In FIG. 9, the layer 41 is etched anisotropically so as to preserve the layer 41 only in the voids 120. Thus a gate insulator 42 is obtained on either side of the layer 12. $HfO_2$ is for example etched anisotropically with a plasma etching chemistry including Ar, $BCl_3$, or $Cl_2$.

Figure 10:
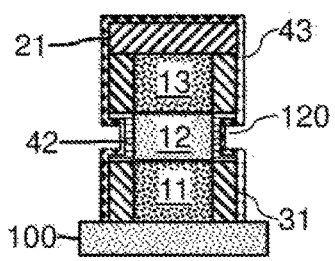

In FIG. 10, a conductive layer 43 is deposited by conformal deposition. In this example, the gate material, corresponding to the layer 43, is TiN. The material of the layer 43 is for example deposited to a thickness of at least 1 nm. The layer 43 is in particular deposited on the gate insulator 42. The layer 43 forming the gate material is for example deposited with an atomic layer deposition process.

Figure 11:
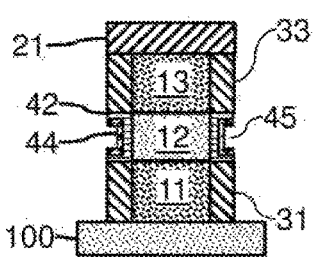

In FIG. 11, the layer 43 is etched anisotropically, so as to preserve the layer 43 only in the voids 120. Thus a gate 44 is obtained on either side of the layer 12, on the gate insulator 42. The edges of the gate 44 thus obtained are self-aligned with the spacers 31 and 33. The gate 44 includes a void 45, i.e. an indent with respect to the edges of the spacers 31 and 33. If the deposition of the layer 43 has a sufficient thickness, this layer 43 of TiN may be etched with an isotropic RIE or ICP etching, while preserving the material of this layer 43 in the voids 120.

The structure of the transistor 1 thus obtained includes a self-alignment between the spacers 31, 33 and the gate 44.

Figure 50:
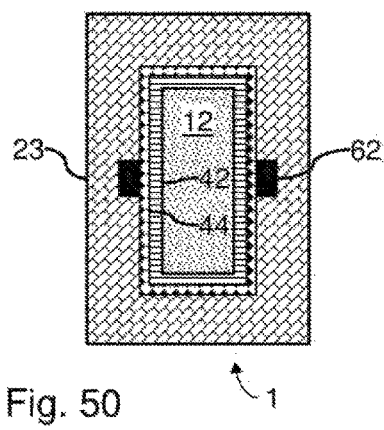
FIGS. 50 and 51 are cross-sectional views showing a plane parallel to the substrate for a field-effect transistor according to the first embodiment.

FIG. 50 is a cross-sectional view of the transistor 1 showing a plane parallel to the substrate 100, level with its gate 44. The transistor 1 obtained here is a gate-all-around transistor, the entire channel zone formed from the layer 12 being encircled by the gate 44. The gate 44 is thus biased to an identical potential all the way around the layer 12.

Figure 51:
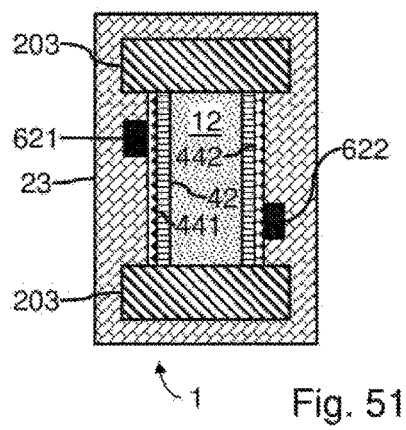

FIG. 51 is a cross-sectional view of a variant of transistor 1, showing a plane parallel to the substrate 100 and level with its layer 12. The transistor 1 illustrated here comprises a gate 441 on one side of the layer 12, and a gate 442 on the other side of the layer 12. The gate 441 is electrically connected to a contact 621. The gate 442 is electrically connected to a contact 622. The gates 441 and 442 (and likewise the contacts 621 and 622) are electrically insulated from each other by way of insulating elements 203 provided on the axial ends of the transistor 1. Such a transistor allows independent gate voltages to be applied to the gates 441 and 442. By applying suitable biases to the gates 441 and 442, it is for example possible to modify the threshold voltage of the transistor 1. It is for example possible to make provision for the potential applied to the gate 441 to be intended to cause the transistor 1 to switch, whereas the bias applied to the gate 442 is intended to modulate the value of the threshold voltage of the transistor 1. The elements 203 may for example be made of Lk dielectric. The elements 203 may extend the entire height of the stack, from the substrate 100 to the top of the layer 13.

The steps detailed below provide an example of how metal contacts may be formed with the gate 44 on the one hand, with a first conductive electrode formed from the layer 11 on the other hand, and moreover with a second conductive electrode formed from the layer 13.

Figure 12:
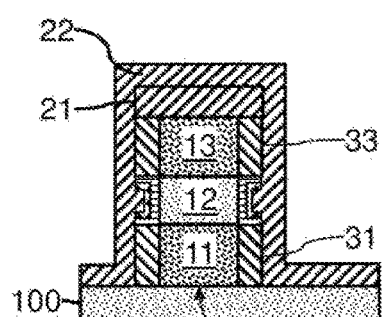

In FIG. 12, a dielectric layer 22 is deposited by conformal deposition. The layer 22 is typically a nitride layer, for example made of a material identical to that of the layer 21.

The stack 10 is thus encapsulated in the layer 22, and the voids 45 of the gate 44 are filled. The layer 22 for example has a thickness of 10 nm. SiN may for example be deposited by an atomic layer deposition process.

Figure 13:
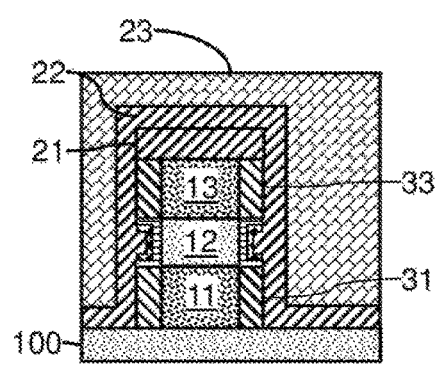

In FIG. 13, a thick dielectric layer 23 is deposited. The layer 23 is for example made of $SiO_2$ or of TEOS. The stack 10 is thus encapsulated under the layer 23. $SiO_2$ may for example be deposited by an atomic layer deposition process.

Figure 14:
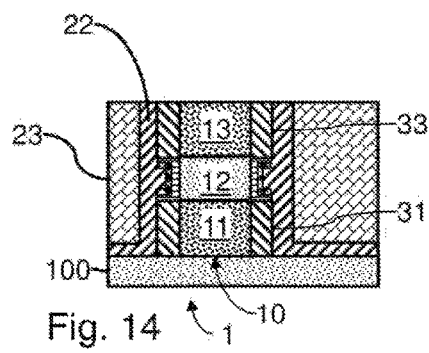

In FIG. 14, a step of chemical-mechanical polishing is carried out. The step of chemical-mechanical polishing is interrupted after the upper face of the layer 13 and of the spacer 33 have been uncovered.

Figure 15:
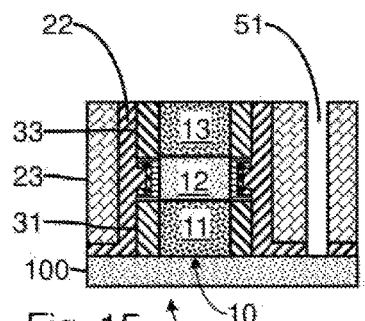

In FIG. 15, photolithography followed by an etching step forms an orifice 51 beside the stack 10. The orifice 51 passes through the layer 23 and the layer 22 and reaches the substrate 100.

Figure 16:
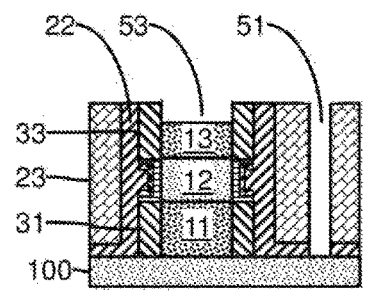

In FIG. 16, photolithography followed by a step of partially etching the layer 13 forms an orifice 53 in this layer 13, in the middle of the spacer 33 encircling the layer 13. The partial etching is for example an etching in hydrochloric-acid vapour.

Figure 17:
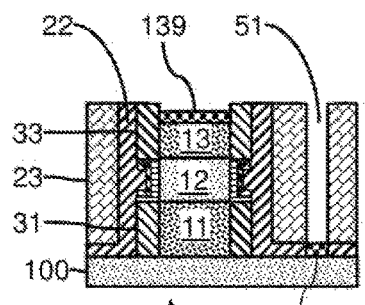

In FIG. 17, a silicidation is advantageously carried out, in order to form a silicide 139 on the layer 13 at the bottom of the orifice 53, and a silicide 119 making contact with the substrate 100, at the bottom of the orifice 51. The silicides 119 and 139 are intended to decrease the contact resistance with the layer 13 and with the substrate 100, respectively. The silicidation may include depositing a metal, which is then diffused into the subjacent semiconductor layer, for example via an annealing step.

Figure 18:
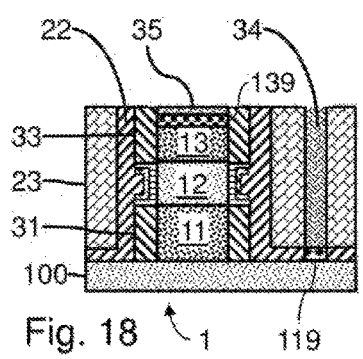

In FIG. 18, the orifices 51 and 53 are filled with a passivating material. Plugs 34 and 35 are thus formed in the orifices 51 and 53, respectively. The plugs 34 and 35 are for example formed from $SiO_2$, for example deposited by an atomic layer deposition process. According to one variant, it is possible to envisage forming the plugs 34 and 35 in the preceding photolithography step, for example using a layer of amorphous carbon. A selectivity to removal may then be preserved, in order not to remove the oxide already present.

Figure 19:
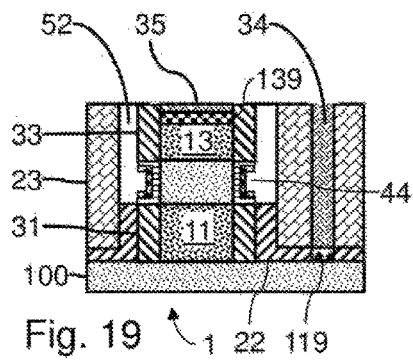

In FIG. 19, the layer 22 is removed until the gate 44 is uncovered. The part of the layer 22 covering the spacer 31 is preserved. An orifice 52 allowing access to the gate 44 is thus produced. The layer 22 is for example removed by a partial etching that is selective with respect to the other materials. Such an etch may be carried out by plasma etching in a chemistry suitable for removing SiN.

Figure 20:
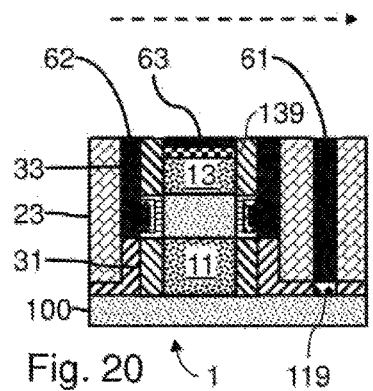

In FIG. 20, the plugs 34 and 35 are removed, for example via a suitable etching. Thus once again access orifices allow access to the silicides 119 and 139. Next a metallization is carried out to fill the various access orifices. A step of chemical-mechanical polishing is then implemented, the polishing being stopped on the layer 23. In this way a metal contact 61 that is electrically connected to the silicide 119, a contact 62 that is electrically connected to the gate 44, and a contact 63 that is electrically connected to the silicide 139 are formed. The metallization is typically produced with a material chosen from the group consisting of Cu, Co, W, Al and Ti.

In this example, it is for example possible to produce a transistor 1 having a width of 85 nm, and the following dimensions in the transverse direction illustrated by the dashed arrow in FIG. 20:

a contact 62 of a thickness of 5 nm on either side of the stack 10;

spacers 31 and 33 of a thickness of 10 nm on either side of the stack 10;

a stack 10 with a parameter ct of 20 nm;

a distance of 15 nm between the contact 62 and the contact 61;

a contact 61 of a thickness of 5 nm;

a distance of 15 nm between the contact 61 and a contact 62 of an adjacent transistor.

In this example, it is also possible to produce a transistor 1 having a width of 50 nm, and the following dimensions in the transverse direction illustrated by the dashed arrow in FIG. 20:

a contact 62 of a thickness of 5 nm on either side of the stack 10;

spacers 31 and 33 of a thickness of 5 nm on either side of the stack 10;

a stack 10 with a parameter ct of 15 nm;

a distance of 5 nm between the contact 62 and the contact 61;

a contact 61 of a thickness of 5 nm;

a distance of 5 nm between the contact 61 and a contact 62 of an adjacent transistor.

Various configurations may be envisaged for the contact 61 to 63, with a view to optimising the integration density of the transistors 1.

Figure 21:
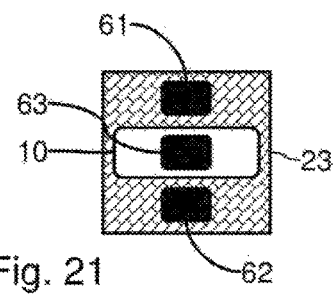
FIGS. 21 to 23 are schematic top views of various contact configurations for a field-effect transistor.

FIG. 21 is a schematic top view of a stack 10 encapsulated in an insulating layer 23, for a transistor produced according to a first variant. In this example, a contact 63 is placed plumb with the stack 10, and makes electrical contact with the layer 13 of the stack 10. Contacts 61 and 62 are placed on either side of the contact 63 of the stack 10, and make electrical contact with the subjacent substrate 100 and the gate of the transistor, respectively.

Figure 22:
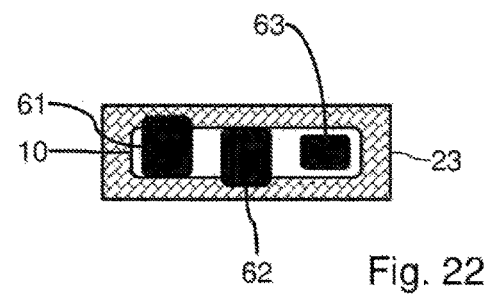

FIG. 22 is a schematic top view of a stack 10 encapsulated in an insulating layer 23, for a transistor produced according to a second variant. In this configuration, the aim is to increase the integration density of the transistors, by making them as narrow as possible. In this example, a contact 63 is placed plumb with the stack 10, and makes electrical contact with the layer 13 of the stack 10. Another contact 61 is placed plumb with the stack 10, and protrudes laterally with respect to the stack 10. The contact 61 extends depthwise, on a first side of the stack 10, far enough to make electrical contact with the substrate 100. Another contact 62 is placed plumb with the stack 10, and protrudes laterally with respect to the stack 10. The contact 62 extends depthwise, on a second side of the stack 10, far enough to make electrical contact with the gate of the transistor. In this configuration, the contacts 61 to 63 are distributed over the length of the stack 10 (which is the largest dimension of the stack 10), and are essentially placed plumb with this stack 10. The transistor thus obtained has a very high compactness.

Figure 23:
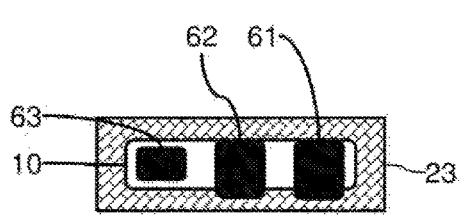
Figure 24:
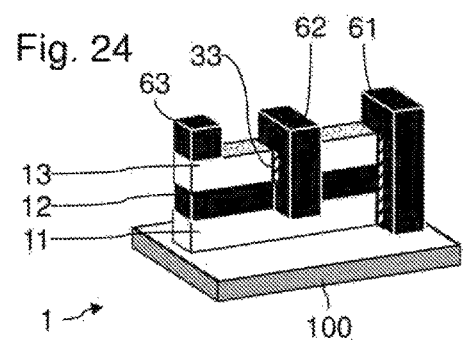
FIG. 24 is a perspective view of the field-effect transistor of FIG. 23.

FIG. 23 is a schematic top view of a stack 10 encapsulated in an insulating layer 23, for a transistor produced according to a third variant. FIG. 24 is a perspective view of the same stack, the insulating layer 23 having been removed for the sake of readability. In this configuration, the aim is to increase the integration density of the transistors, by making them as narrow as possible. In this example, a contact 63 is placed plumb with the stack 10, and makes electrical contact with the layer 13 of the stack 10. Another contact 61 is placed plumb with the stack 10, and protrudes laterally with respect to the stack 10. The contact 61 extends depthwise, on one side of the stack 10, far enough to make electrical contact with the substrate 100. Another contact 62 is placed plumb with the stack 10, and protrudes laterally with respect to the stack 10. The contact 62 extends depthwise, on the same side of the stack 10 as the contact 61, far enough to make electrical contact with the gate of the transistor. In this configuration, the contacts 61 to 63 are distributed over the length (which is the largest dimension of the stack 10) of the stack 10, and are essentially placed plumb with this stack 10. Moreover, the contacts 61 and 62 protrude laterally on the same side of the stack 10, allowing the transistor to be made even more compact. The lateral protrusion of the contact 62 is insulated from the layer 13 by the spacer 33. The lateral protrusion of the contact 61 is insulated from layers 13 and 12 by the spacer 33 and by a portion of the layer 22, respectively.

Figure 25:
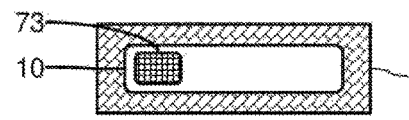
FIGS. 25 to 27 are schematic representations of various photolithography masks that may be used to form a field-effect transistor such as illustrated in FIG. 23.
Figure 26:
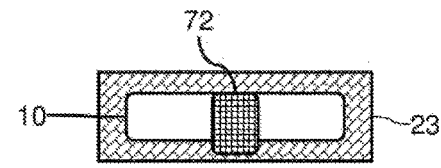
Figure 27:
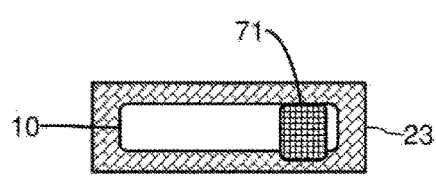

FIGS. 25 to 27 schematically illustrate various photolithography masks that may be used in succession to etch the contacts 61 to 63. In FIG. 25, the pattern 73 corresponds to the shape of the etching for the contact 63. In FIG. 26, the pattern 72 corresponds to the shape of the etching for the contact 62. In FIG. 27, the pattern 71 corresponds to the shape of the etching for the contact 61. More precise details of examples of steps of forming contacts 61 to 63 are given with reference to FIGS. 28 to 37.

Figure 28:
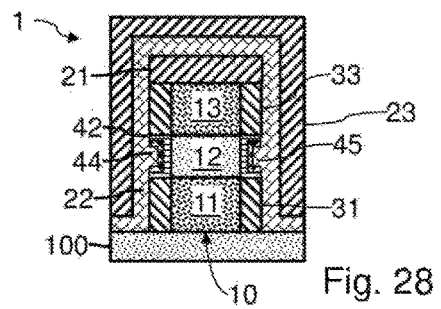
FIGS. 28 to 35 are transverse cross-sectional views during various steps of a process for fabricating a field-effect transistor such as illustrated in FIG. 23.
Figure 29:
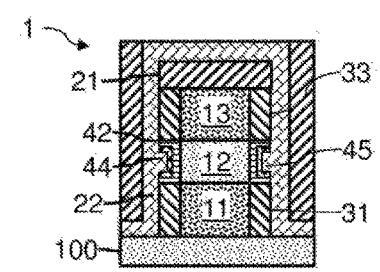

For example, starting with the structure described with reference to FIG. 11, to obtain the structure illustrated in FIG. 28 in transverse cross section, a dielectric layer 22 is deposited by conformal deposition in order to encapsulate the stack 10. The layer 21 is for example made of $SiO_2$, and the layer 22 may be made of SiN, which is for example deposited by atomic layer deposition. Next, a layer 23, which is for example made of $SiO_2$, is deposited. The stack 10 and the layer 22 are thus encapsulated under the layer 23. $SiO_2$ may for example be deposited by an atomic layer deposition process. In FIG. 29, a chemical-mechanical polishing step is carried out, the polishing being stopped on the SiN layer 22.

Figure 30:
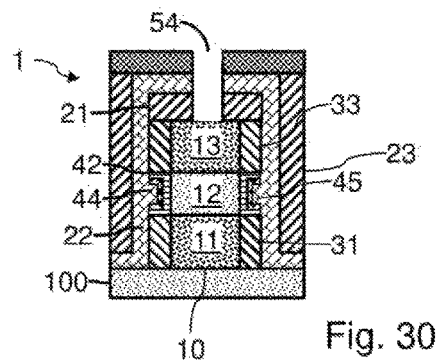

FIG. 30 illustrates the structure in transverse cross section, level with a contact to be formed with the layer 13. A mask 24 is deposited over the entire wafer. Via steps of photolithography and etching, an orifice 54 is produced through the mask 24, the layer 22 and the layer 21, until a portion of the layer 13 is uncovered only at the bottom of the orifice 54. The orifice 54 extends over only a small portion of the length of the stack 10.

Figure 31:
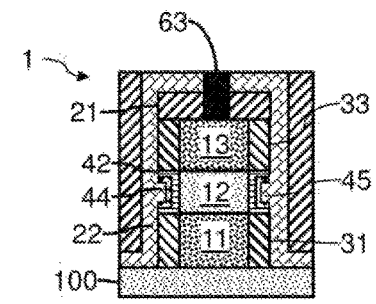

In FIG. 31, a metallization is carried out so as to fill the orifice 54, then a step of chemical-mechanical polishing, the polishing being stopped on the layer 22. Thus a metal contact 63 making electrical contact with the layer 13 is obtained.

Figure 32:
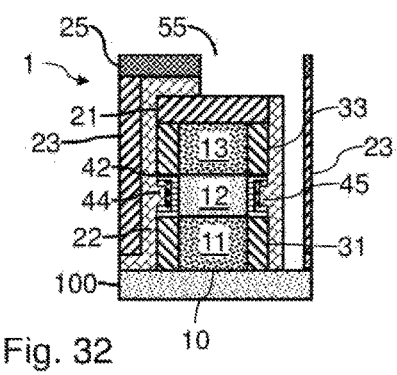

FIG. 32 illustrates the structure in transverse cross section, level with a contact to be formed with the substrate 100 (to form an electrical contact with the layer 11). A mask 25 is deposited over the entire wafer. Via steps of photolithography and etching, an orifice 55 is produced through the mask 25. The orifice 55 protrudes laterally on one side of the stack 10, beyond the layer 22. The orifice 55 is produced by etching a portion of the layer 22, the etching being stopped on the layer 21. The orifice 55 is also produced by etching a portion of the layer 23 on one flank of the layer 22. A portion of the layer 22 is also removed plumb with the etched portion of the layer 23, in order to form an access to the substrate 100. The orifice 55 extends only over a small portion of the length of the stack 10. The orifice 55 is offset longitudinally with respect to the orifice 54.

Figure 33:
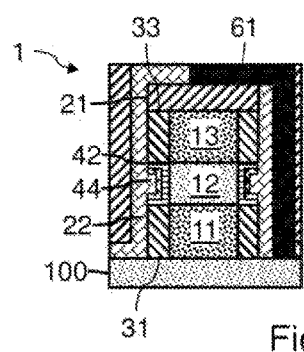

In FIG. 33, a metallization is carried out so as to fill the orifice 55, then a step of chemical-mechanical polishing is carried out, the polishing being stopped on the layer 22. Thus a metal contact 61 making electrical contact with the substrate 100 is obtained. The metal contact 61 is electrically insulated from the gate 44 and the layer 13 by the layer 22.

Figure 34:
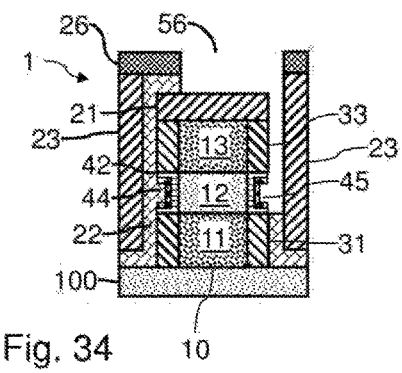

FIG. 34 illustrates the structure in transverse cross section level with a contact to be formed with the gate 44. In this example, the contact formed makes electrical contact only with one side of the gate 44. A mask 26 is deposited over the entire wafer. Via steps of photolithography and etching, an orifice 56 is produced through the mask 26. The orifice 56 protrudes laterally on one side of the stack 10, beyond the layer 22. The orifice 56 is produced by anisotropically etching a portion of the layer 22 plumb with the layer 21. The orifice 56 is also produced by etching a portion of the layer 22 which is between the stack 10 and the layer 23. The etching of the layer 22 is interrupted level with the gate 44, before the spacer 31 is reached. The orifice 56 extends only over a small portion of the length of the stack 10.

Figure 35:
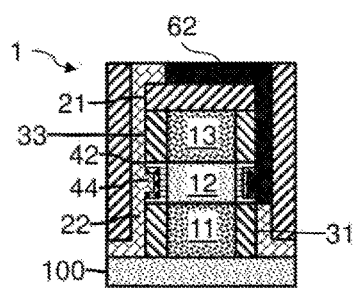

In FIG. 35, a metallization is carried out so as to fill the orifice 56, then a step of chemical-mechanical polishing is carried out, the polishing being stopped on the layer 22. Thus a metal contact 62 making electrical contact with the gate 44 is obtained. The metal contact 62 is electrically insulated from the layer 13 by the spacer 33. The orifice 56 is offset longitudinally with respect to the orifices 54 and 55.

Figure 36:
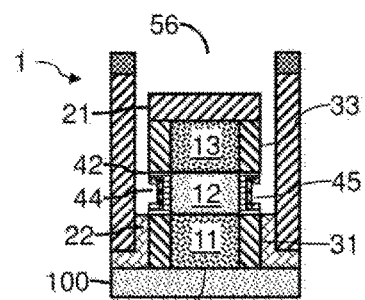
FIGS. 36 and 37 are transverse cross-sectional views during various steps of a process for fabricating a field-effect transistor according to one variant of the transistor in FIG. 23.

FIG. 36 illustrates the structure in transverse cross section level with a contact to be formed with the gate 44. In this example, the contact formed makes electrical contact with both sides of the gate 44. The process steps are substantially identical to those described with reference to FIGS. 34 and 35. In contrast to the steps illustrated in FIGS. 34 and 35 however, the orifice 56 produced through the mask 26 protrudes laterally on both sides of the stack 10, beyond the layer 22. The orifice 56 is also produced by etching a portion of the layer 22 plumb with the layer 21. The orifice 56 is also produced by etching a portion of the layer 22 which is between the stack 10 and the layer 23, on either side of the stack 10. The etching of the layer 22 is also interrupted level with the gate 44, before the spacer 31 is reached.

Figure 37:
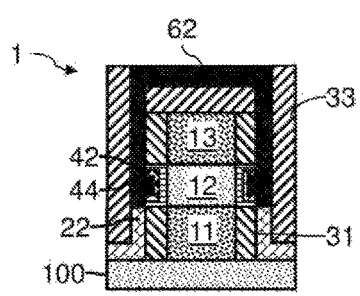

In FIG. 37, a metallization is carried out so as to fill the orifice 56, then a step of chemical-mechanical polishing is carried out, the polishing being stopped on the layer 22. Thus a metal contact 62 making electrical contact with the gate 44 on either side of the stack 10 is obtained, thereby making it easier to bias the gate 44. The metal contact 62 is electrically insulated from the layer 13 by the spacer 33. The orifice 56 is offset longitudinally with respect to the orifices 54 and 55.

The techniques used to form the contact 62 for the gate 44 are insensitive to variability in the process used to etch the orifice 56. Thus, even if the etch of the orifice 56 does not reach the depth of the interface between the layers 11 and 12, an electrical contact is nonetheless obtained, provided that the contact 62 reaches the gate 44. Moreover, even if the etch of the orifice 56 exceeds the depth of the interface between the layers 11 and 12, the contact 62 remains insulated from the layer 11 by the spacer 31. The depth of the etch of the orifice 56 may even be used to either modify the gate contact resistance, or to modify the gate parasitic capacitance.

Another variant may be envisaged to decrease the number of steps of the fabricating process, starting from the structure illustrated in FIG. 29. A single photolithography step is used to define for example the pattern of the orifices 54 and 55, then an etch is carried out until the layer 21 is uncovered. The layer 23, which is now accessible through the orifice 55, is etched until the layer 22 is reached on the side of the stack 10. The layer 21 is removed through the orifice 54 transferring its pattern. The layer 22 initially under the etched layer 23 is removed, so as to provide access to the substrate 100. It is then possible to implement a single metallization step in order to fill the orifices 54 and 55, then a single step of chemical-mechanical polishing, the polishing being stopped on the layer 22.

In the examples detailed above, the layers 11 and 13 have a uniform composition. However, it is also possible to envisage that the layer 11 and/or the layer 13 include a superposition of materials having different compositions. Such differences in composition allow for example distinct localized processing steps to be carried out on the layers 11 and 13. Such differences in composition also allow etching selectivities or electrical properties to be improved, depending on the circumstances. The layer 11 and/or the layer 13 may for example comprise a superposition of silicon-germanium alloy layers, with various concentrations of germanium and/or various concentrations of dopants. Such layers of different compositions may for example be deposited in various epitaxial deposition steps.

In the examples detailed above, the spacers 31 and 33 have a uniform composition. However, it may also be envisaged that the spacer 31 and/or the spacer 33 include a superposition of materials having different compositions.

Figure 38:
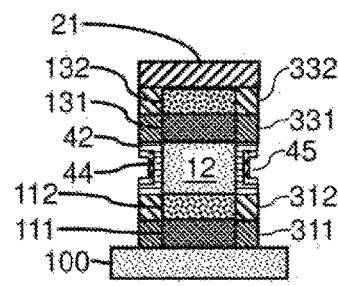
FIG. 38 is a transverse cross-sectional view of a field-effect transistor according to the first embodiment, including layers of heterogeneous compositions.

In the example illustrated in FIG. 38, the transistor 1 includes:
  a spacer 31 including a superposition of layers 311 and 312 of different compositions
  a spacer 33 including a superposition of layers 331 and 332 of different compositions;
  a semiconductor material layer 11 including a superposition of layers 111 and 112 of different compositions (for example with different germanium concentrations);
  a semiconductor material layer 13 including a superposition of layers 131 and 132 of different compositions (for example with different germanium concentrations).

In the examples detailed above, the layer 12 has a uniform composition. However, it may also be envisaged that the layer 12 include a combination of materials having different compositions. Such differences in composition for example allow mechanical strains to be induced in the channel zone.

Figure 39:
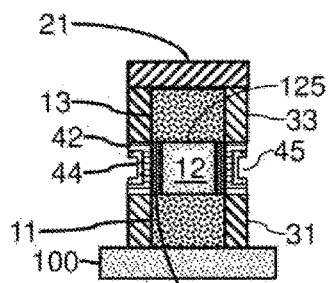
FIG. 39 is a transverse cross-sectional view of a field-effect transistor according to the first embodiment, with a channel layer comprising a median portion and a peripheral portion made of different materials.

In the example illustrated in FIG. 39, the layer 12 comprises a median portion 125 and a peripheral portion 126 encircling the median portion 125. For example, for a median portion 125 made of silicon, the peripheral portion 126 may be made of a silicon-germanium alloy. The peripheral portion 126 may for example be deposited by epitaxial growth from the median portion 125. By using a peripheral portion 126 having a crystal lattice parameter sufficiently different from that of the median portion 125, it is possible to induce mechanical strains in the median portion 125, so as to modify electrical conduction properties. Strains may for example be induced in the median portion 125, in order to improve the conduction in the peripheral portion 126.

Figure 40:
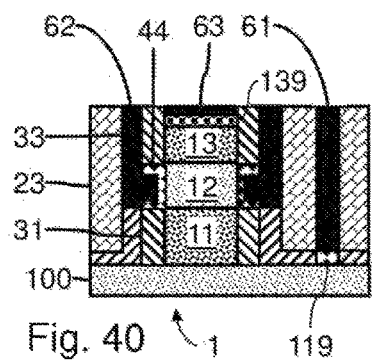
FIG. 40 is a transverse cross-sectional view of a vertical bipolar transistor according to the invention.

In the preceding examples, vertical-channel field-effect transistors were illustrated, these transistors thus comprising a superposition of a source, a channel zone and a drain in the vertical direction. The invention may also be applied to a bipolar transistor comprising a superposition of a base, a collector and an emitter. FIG. 40 illustrates an example of such a bipolar transistor 1. With respect to the transistor illustrated in FIG. 20, the transistor 1 comprises a base electrode 44 making direct contact with the lateral faces of the layer 12, the transistor 1 therefore being devoid of gate insulator 42.

Figure 41:
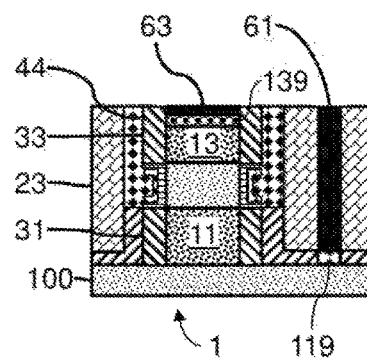
FIG. 41 is a transverse cross-sectional view of a field-effect transistor according to the first embodiment with a gate and a gate contact that are formed in continuity.

In the variant illustrated in FIG. 41, the gate metal is advantageously used to form in continuity both the gate 44 and the gate contact.

Figure 42:
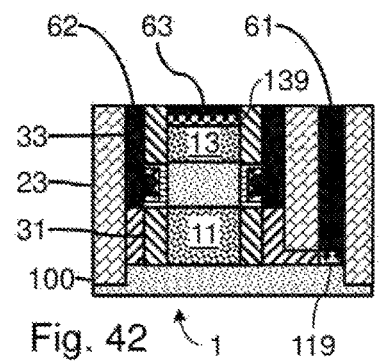
FIG. 42 is a transverse cross-sectional view of a field-effect transistor according to another variant of the first embodiment.

In the variant illustrated in FIG. 42, a mesa etch is carried out on the substrate 100, in order to extend the insulating layer 23 into the substrate 100 and thus electrically isolate the transistor. It is also possible to envisage isolating the transistor with STIs.

Figure 43:
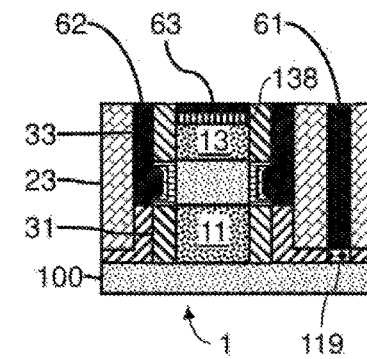
FIG. 43 is a transverse cross-sectional view of a field-effect transistor according to the first embodiment, with a memory node integrated between a contact and a drain.

In the variant illustrated in FIG. 43, an RRAM or OxRAM memory node is integrated between the contact 63 and the layer 13. For this purpose, the silicide 139 of the transistor 1 of FIG. 20 is here replaced by a dielectric layer 138 that is configured to selectively form a conductive filament between the contact 63 and the layer 13. A memory node is thus formed between the layer 13 and the contact 63.

FIGS. 44 to 49 are transverse cross-sectional views of an example transistor 1 in different steps of an example of a second embodiment of a fabricating process.

Figure 44:
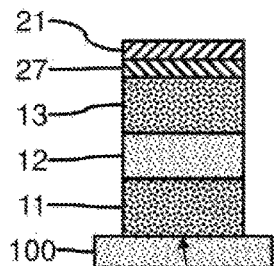
FIGS. 44 to 49 are transverse cross-sectional views during various steps of a process for fabricating a vertical-channel field-effect transistor according to one example of a second embodiment of the invention.

In FIG. 44 a substrate 100 surmounted with a stack such as detailed with reference to FIG. 2 is provided. The stack 10 differs from that illustrated in FIG. 2 only in that a dielectric material layer 27 (for example made of silicon oxide) is present between the insulating layer 21 and the layer 13. The layers 21 and 27 may be used beforehand to anisotropically etch the layers 11 to 13, so that they have substantially the same length and the same width, corresponding to the pattern of the layers 21 and 27.

Figure 45:
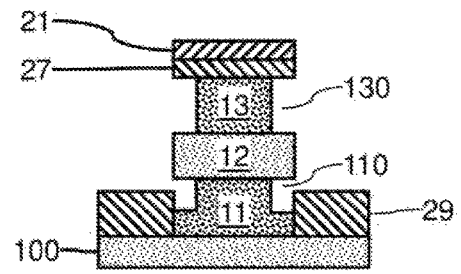

In FIG. 45, a partial encapsulation is achieved by depositing a dielectric material layer 29 on the substrate 100, on either side of the stack 10. The dielectric material layer 29 has a thickness smaller than that of the layer 11. The layer 29 thus does not reach the layer 12.

Next, the layers 11 and 13 are partially etched with an etch that is selective with respect to the layers 12, 21, 27 and 29. Thus a void 110 is formed on either side of the residual layer 11, and a void 130 is formed on either side of the residual layer 13. The voids 110 and 130 extend to the lower surface 121 and to the upper surface 122 of the layer 12, respectively. Because of the presence of the dielectric material layer 29, the lower portion of the layer 11 is preserved, so that the recesses 110 do not reach the substrate 100.

Figure 46:
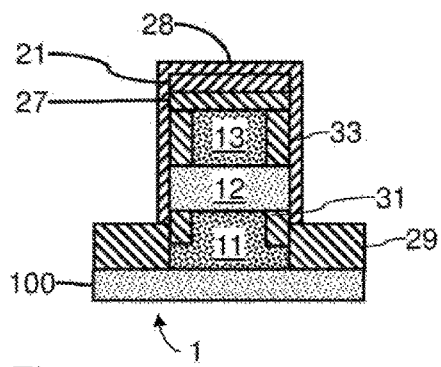

In FIG. 46, the voids 110 and 130 are filled with an Lk dielectric material. The deposited dielectric material in particular makes contact with the previously uncovered portion of the lower 121 and upper surfaces, 122. The Lk dielectric material is anisotropically etched. The layers 12, 21 and 27 serve as mask for the anisotropic etching, and hence the spacers 31 and 33 are self-aligned with the layers 21, 27 and 12. A spacer 31 is thus formed on the periphery of the layer 11, and a spacer 33 is formed on the periphery of the layer 13. The anisotropic etching uncovers a lateral face of the layer 12. A dielectric material layer 28 is then deposited by conformal deposition so as to encapsulate the stack 10 equipped with the spacers 31 and 33. In this example, the dielectric material of the layer 28 is the same as that of the layer 21.

Figure 47:
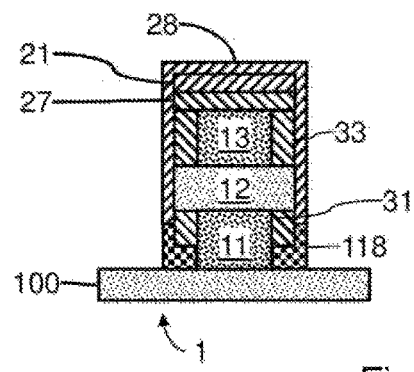

In FIG. 47, the dielectric material layer 29 is removed by etching with an etch that is selective with respect to the layer 28. A lateral access is thus produced allowing access to the spacer 31 and to the bottom portion of the layer 11. Next, a metal deposit making contact with the spacer 31 and the bottom portion of the layer 11 is deposited. Next, a silicide 118 making contact on the one hand with the layer 11 and on the other hand with the substrate 100 is formed, for example by annealing the metal deposit. According to one variant, after the lateral access allowing access to the spacer 31 and to the bottom portion of the layer 11 has been produced, the following are also carried out:

an epitaxial deposition on the bottom portion of the layer 11;
a metallization making contact with this epitaxial deposition;

a silicidation of the epitaxial deposition with the deposited metal.

Figure 48:
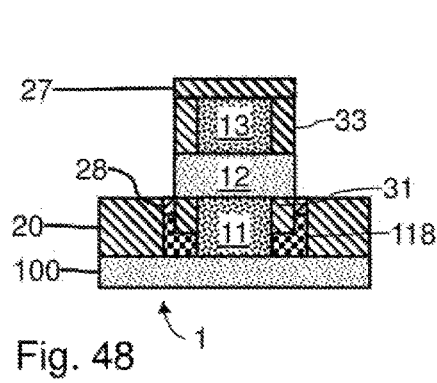

In FIG. 48, an encapsulation is formed by depositing a dielectric material layer 20 (for example made of silicon oxide) up to the level of the interface between the layers 11 and 12. Next, the layers 21 and 28 are partially and anisotropically etched, the etching being stopped on the dielectric layer 20. Thus, a portion of the layer 28 which is between the spacer 31 and the dielectric layer 20, plumb with the silicide 118, is preserved.

Figure 49:
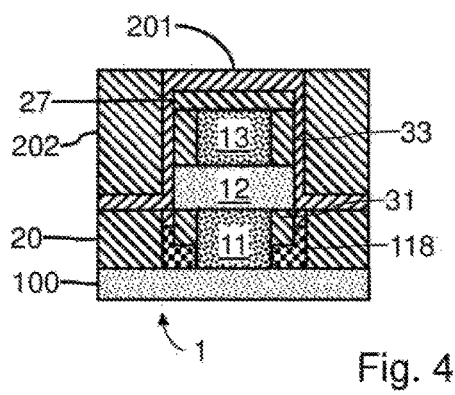

In FIG. 49, the stack 10 is encapsulated by conformal deposition of a dielectric material layer 201 (for example of SiN). Next, the stack 10 is encapsulated by depositing a dielectric layer 202 (for example made of silicon oxide). Next, a chemical-mechanical polishing step is carried out, the polishing being stopped on the layer 201.

Contacts may subsequently be formed, for example according to the teaching detailed above.

Such a process thus makes it possible to decrease the contact resistance with the layer 11, for which the height of the metal contact is larger than for the layer 13, because of its position at the bottom of the stack 10.

According to one variant, it is possible to envisage forming an RRAM memory node on a contact of the transistor. It is thus possible to obtain an RRAM memory of minimal bulk and that is self-aligned with a current-limiting transistor.

FIGS. 52 to 61 are transverse cross-sectional views during various steps of a variant process for fabricating a vertical-channel field-effect transistor according to an example of a third embodiment of the invention.

Figure 52:
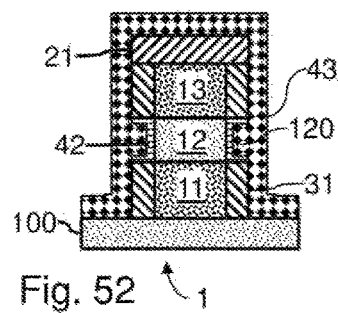
FIGS. 52 to 61 are transverse cross-sectional views during various steps of a process for fabricating a vertical-channel field-effect transistor according to one example of a third embodiment of the invention.

Starting for example with the structure illustrated in FIG. 9, in the configuration illustrated in FIG. 52, a conductive material layer 43 has been deposited by conformal deposition. In this example, the gate material, corresponding to the layer 43, is TiN. The material of the layer 43 is for example deposited to a thickness of at least 5 nm. The layer 43 is in particular deposited on the gate insulator 42. The layer 43 forming the gate material is for example deposited with an atomic layer deposition process.

Figure 53:
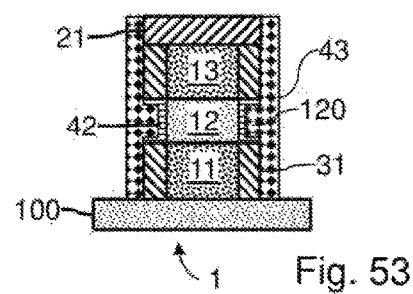

In FIG. 53, the layer 43 is anisotropically etched so as to preserve the layer 43 only on the flanks of the stack of the layers 11 to 13 and in the interior of the voids 120. The substrate 100 is uncovered on either side of this stack. The layer 21 is also uncovered on the top of the stack.

Figure 54:
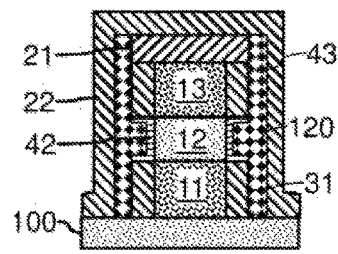

In FIG. 54, a dielectric material layer 22 is deposited by conformal deposition. The layer 22 is typically a nitride layer, for example of SiN. The layer 22 is advantageously formed from a different material from the layer 21. The stack 10 is thus encapsulated in the layer 22. SiN may for example be deposited by an atomic layer deposition process.

Figure 55:
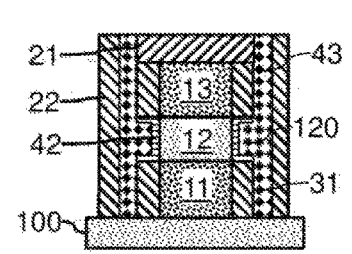

In FIG. 55, the layer 22 is anisotropically etched so as to preserve the layer 22 only on the flanks of the stack of the layers 11 to 13. The substrate 100 is uncovered on either side of this stack. The layer 21 is also uncovered on the top of the stack.

Figure 56:
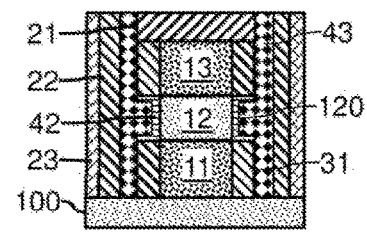

In FIG. 56, a dielectric material layer 23 is deposited by conformal deposition and then this layer 23 is subjected to a chemical-mechanical polish, the polish being stopped on the layer 21. The layer 23 is for example made of $SiO_2$ or of TEOS. $SiO_2$ may for example be deposited by an atomic layer deposition process. The layer 23 is then preserved on either side of the stack 10.

Figure 57:
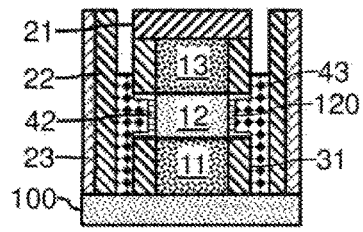

In FIG. 57, the upper portion of the layer 43 is removed. The layer 43 is removed until the layer 13 is reached depthwise, but without reaching the layer 12. Cavities are then obtained.

Figure 58:
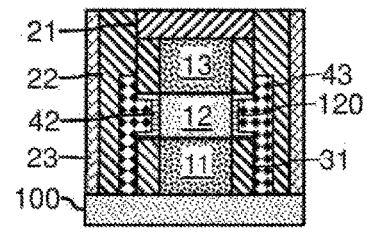

In FIG. 58, the cavities obtained in FIG. 57 are filled with the same material as that of the layer 22, thus covering the layer 43 and the flanks of the layer 21.

Figure 59:
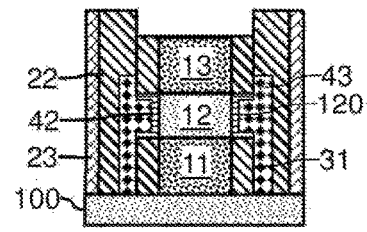

In FIG. 59, via suitable masking, the layer 21 is selectively removed from the zone in which it is desired to form a contact with the layer 13. A portion of the layer 13 is thus uncovered.

Figure 60:
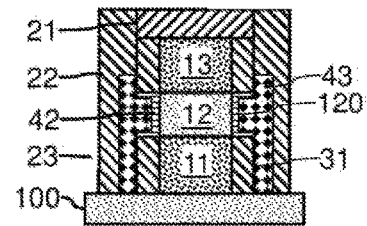

In FIG. 60, via suitable masking, the layer 23 is selectively removed from the zone in which it is desired to form a contact with the layer 11, by way of the substrate 100. A portion of the substrate 100 is thus uncovered.

Figure 61:
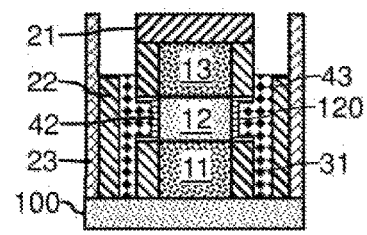

In FIG. 61, via suitable masking, the layer 22 is selectively removed from the zone in which it is desired to form a gate contact. The layer 22 is etched until the layer 43 is reached in this zone.

A single metallization step may be used to form the drain contact, the gate contact and the source contact of the transistor.

The invention claimed is:

1. A process for fabricating a vertical transistor, comprising steps of:
   providing a substrate surmounted by a stack of first, second, and third layers made of first, second, and third semiconductor materials, respectively, said second semiconductor material being different from the first and third semiconductor materials;
   partially etching the first and third layers with an etching that is selective with respect to the second layer and that is stopped on a lower surface and on an upper surface of the second layer, so as to form a first void in the first layer and a third void in the third layer, said first and third voids extending to the lower surface and to the upper surface of the second layer, respectively;
   filling said first and third voids with a dielectric material in order to form first and second spacers that make contact with the lower surface and the upper surface of the second layer, respectively;
   partially etching the second layer with an etching that is selective with respect to the dielectric material of said first and second spacers, so as to form a second void in the second layer between the first and second spacers; and
   depositing a conductor material in the second void.

2. The process for fabricating a vertical transistor according to claim 1, wherein said providing step is preceded by steps of:
   forming a hard-mask pattern on the third semiconductor layer; and
   transferring the pattern of the hard mask to the first to third layers by anisotropic etching.

3. The process for fabricating a vertical transistor according to claim 2, wherein:
   said step of filling the first and third voids comprises a conformal deposition of said dielectric material, and
   the process further comprises a step of transferring the pattern of the hard mask to said dielectric material by anisotropic etching, so as to uncover a lateral face of the second layer.

4. The process for fabricating a vertical transistor according to claim 3, wherein said conformal deposition of said dielectric material is produced with a thickness larger than a depth of said first and third voids.

5. The process for fabricating a vertical transistor according to claim 2,
   wherein said conductor material is deposited by conformal deposition, and
   the process further comprises a step of transferring the pattern of the hard mask to said conductor material by anisotropic etching.

6. The process for fabricating a vertical transistor according to claim 5, wherein said conformal deposition of said conductor material is carried out so as to produce a void in an electrode thus formed.

7. The process for fabricating a vertical transistor according to claim 1,
   wherein the fabricated transistor is a vertical-channel field-effect transistor, and
   the process further comprises a step of depositing in the second void a gate insulator that makes contact with the second layer, said conductor material being a gate material deposited on said gate insulator.

8. The process for fabricating a vertical transistor according to claim 1, wherein the fabricated transistor is a bipolar transistor, said conductor material being deposited in the second void so as to make contact with said second layer.

9. The process for fabricating a vertical transistor according to claim 1,
   wherein said second void once formed extends on either side of the second layer, and
   wherein said conductor material once formed extends on either side of the second layer in two conductive electrodes that are electrically insulated from each other.

10. The process for fabricating a vertical transistor according to claim 1,
    wherein said second void once formed extends all the way around a periphery of the second layer, and
    wherein said conductor material once formed extends all the way around the periphery of the second layer.

11. The process for fabricating a vertical transistor according to claim 1, further comprising steps of:
    depositing a fourth layer made of dielectric material on the first and second spacers and on said conductor material, the fourth layer being made from a material different from that of the first and second spacers;
    depositing a fifth layer made of a dielectric material that is different from that of the fourth layer;
    partially etching the fourth layer so as to at least partially uncover said conductor material; and
    forming a first contact making electrical contact with said conductor material.

12. The process for fabricating a vertical transistor according to claim 11, further comprising steps of:
    etching the fifth layer so as to at least partially uncover said substrate; and
    forming a second contact making electrical contact with said substrate.

13. The process for fabricating a vertical transistor according to claim 12, further comprising a step of forming a third contact making electrical contact with said third layer, said first to third contacts being positioned in a distributed manner over a length of said stack.

14. The process for fabricating a vertical transistor according to claim 12, wherein said first and second contacts extend laterally with respect to said stack, on a same side of said stack.

15. The process for fabricating a vertical transistor according to claim 1, furthermore comprising a step of forming a silicide in said first layer, said silicide making contact with said substrate.

16. The process for fabricating a vertical transistor according to claim 1, wherein said step of partially etching the first and third layers with an etching that is selective is carried out so as to preserve a thickness of the second layer.

17. The process for fabricating a vertical transistor according to claim 1, wherein said step of filling the first and third voids with dielectric material is carried out so as to form first and second spacers having a same dimension as the first and third layers in a stacking direction, respectively.

18. The process for fabricating a vertical transistor according to claim 1, wherein said step of partially etching the second layer with an etching that is selective is carried out so as to preserve a dimension of said first and second spacers in a stacking direction.

\* \* \* \* \*